(12) United States Patent
Yang et al.

(10) Patent No.: US 8,266,797 B2
(45) Date of Patent: Sep. 18, 2012

(54) METHOD OF MANUFACTURING A MULTI-LAYER SUBSTRATE

(75) Inventors: Chih-Kuang Yang, Hsinchu (TW); Cheng-Yi Chang, Hsinchu (TW)

(73) Assignee: Princo Middle East FZE, Dubai (AE)

( * ) Notice: Subject to any disclaimer, the term of this patent is extended or adjusted under 35 U.S.C. 154(b) by 0 days.

(21) Appl. No.: 13/092,319

(22) Filed: Apr. 22, 2011

(65) Prior Publication Data

US 2011/0198782 A1    Aug. 18, 2011

Related U.S. Application Data

(62) Division of application No. 11/960,107, filed on Dec. 19, 2007.

(30) Foreign Application Priority Data

Jun. 22, 2007    (TW) ................................ 96122606 A

(51) Int. Cl.
  *H01K 3/10* (2006.01)
(52) U.S. Cl. ................ 29/852; 29/830; 29/831; 29/832; 29/846; 29/847
(58) Field of Classification Search ............. 29/852, 29/832, 831, 830, 846, 829, 837, 838, 839, 29/856; 257/777, 778, 784, 703, 834, 724; 264/483, 477; 361/719, 728, 679.55, 679.02, 361/720, 738
See application file for complete search history.

(56) References Cited

U.S. PATENT DOCUMENTS

| | | | |
|---|---|---|---|
| 4,893,404 A * | 1/1990 | Shirahata et al. ............... | 29/852 |
| 5,534,666 A | 7/1996 | Ishida | |
| 5,764,119 A | 6/1998 | Miyagi et al. | |
| 6,036,809 A | 3/2000 | Kelly et al. | |
| 6,391,220 B1 * | 5/2002 | Zhang et al. ..................... | 216/67 |
| 6,465,886 B1 * | 10/2002 | Horiuchi et al. ............... | 257/738 |
| 6,714,422 B2 | 3/2004 | Okubora et al. | |
| 6,764,748 B1 | 7/2004 | Farquhar et al. | |
| 6,941,648 B2 | 9/2005 | Shimizu et al. | |
| 6,977,348 B2 | 12/2005 | Ho et al. | |
| 7,164,197 B2 | 1/2007 | Mao et al. | |

(Continued)

FOREIGN PATENT DOCUMENTS

| | | |
|---|---|---|
| CN | 1274256 | 11/2000 |
| CN | 1384701 | 12/2002 |
| CN | 1131883 | 12/2003 |
| CN | 1535106 | 10/2004 |

(Continued)

*Primary Examiner* — Derris Banks
*Assistant Examiner* — Tai Nguyen
(74) *Attorney, Agent, or Firm* — Kirton McConkie; Evan R. Witt

(57) ABSTRACT

Disclosed are a multi-layer substrate and a manufacturing method of the multi-layer substrate. By employing a carrier to alternately form dielectric layers and metal structure layers thereon. Each dielectric layer adheres with the adjacent dielectric layer to embed the metal structure layers in the dielectric layers corresponding thereto. Comparing with prior arts, which have to use prepregs when hot pressing and adhering different layers of different materials, the present invention takes fewer processes, thus, fewer kinds of materials without using prepregs. Therefore, the present invention can promote the entire quality and yield of manufacturing the multi-layer substrate to satisfy mechanical characteristic matching of the multi-layer substrate and to reduce cost of the whole manufacturing process. Significantly, the multi-layer substrate having thin dielectric layers according to the present invention can satisfy the concern of impedance matching therefore, and can reduce crosstalk influence to keep good signal integrity therein.

9 Claims, 7 Drawing Sheets

U.S. PATENT DOCUMENTS

| | | |
|---|---|---|
| 7,253,363 B2 | 8/2007 | Iwasaki et al. |
| 7,265,440 B2 | 9/2007 | Zilber et al. |
| 7,626,270 B2 | 12/2009 | Chen et al. |
| 7,728,234 B2 | 6/2010 | Wang |
| 7,791,186 B2 | 9/2010 | Kikuchi et al. |
| 2002/0131247 A1 | 9/2002 | Cooray |
| 2005/0146403 A1 | 7/2005 | Okubora |
| 2006/0016553 A1 | 1/2006 | Watanabe |
| 2006/0145350 A1 | 7/2006 | Gross |
| 2007/0076348 A1 | 4/2007 | Shioga et al. |
| 2007/0079986 A1 | 4/2007 | Kikuchi et al. |
| 2007/0145602 A1* | 6/2007 | Yang .................. 257/777 |

FOREIGN PATENT DOCUMENTS

| | | |
|---|---|---|
| CN | 1996582 | 7/2007 |
| CN | 101127330 | 2/2008 |
| JP | 2002-335082 | 11/2002 |
| JP | 2003-174243 | 6/2003 |
| JP | 2005-243999 | 9/2005 |
| JP | 2006310627 | 11/2006 |
| KR | 10-0734761 | 7/2007 |
| TW | 228794 | 3/2005 |
| TW | 238030 | 8/2005 |
| TW | 264444 | 10/2006 |

* cited by examiner

METHOD OF MANUFACTURING A MULTI-LAYER SUBSTRATE

CROSS REFERENCE TO RELATED APPLICATION

This is a division of U.S. patent application Ser. No. 11/960,107, filed on Dec. 19, 2007, which application is incorporated by reference.

BACKGROUND OF THE INVENTION

1. Field of the Invention

The present invention generally relates to a method of manufacturing a multi-layer substrate, and more particularly to a method of manufacturing a flexible multi-layer substrate.

2. Description of Prior Art

Please refer to FIG. 1, which depicts a diagram of multi-layer substrate manufactured by hot pressing and adhering different layers according to prior art. Basically, a multi-layer substrate that is manufactured by hot pressing and adhering is called Sequential Lamination from double side according to prior arts. First, a core 100 with copper clad 102 is provided. A lithography process and a development process are proceeded to the copper clad 102 to form pattern thereon (as being a metal structure layer, i.e. metal lines for transmitting signals). Then, laminating a prepreg 104, another core 100 which already had the metal structure layer 102 and another prepreg 104 laminated onto, and so on. After laminating the last surface copper clad 102 on the last prepreg 104, the multi-layer substrate is hot pressed at a high temperature. Afterwards, there can be a lithography process and a development process to the last surface copper clad 102 to form a pattern thereon. Then, a solder mask 106 is coated on the last surface copper clad 102.

As aforementioned, with hot pressing and adhering called Sequential Lamination according to prior arts, the prepregs 104 between different layers with different materials are essential for making the different layers adhered to each other. Moreover, due to complication of modern circuit design, many necessary detail processes coming up with, such as drilling, plating via or hole, etching, cleaning, polishing, black oxidizing and etc. Moreover, pre-processes for the aforesaid detail processes can also be relevant and more involved. Accordingly, the prior arts are complicated with many composite materials, such as, core 100 having the copper clad 102, the prepregs 104, the solder mask 106 and etc. are needed. Therefore, one process failure can cause the whole multi-layer substrate to breakdown and decrease the yield thereof. It's not easy to control the process quality and the manufacture cost because too many materials are being used.

Besides, miniaturization for electronic productions is an unavoidable trend in this modern world. The aforesaid multi-layer substrate manufactured by hot pressing and adhering has limitation of trace pattern for size minimization. According to prior arts, the thickness of the core is about 100 μm and the thickness of the prepreg is about 50 μm, therefore, the thickness of an 8-layer substrate product is about 600 μm. In prior arts, the dielectric layers (defined as substance between two copper clads) may use numerous kinds of materials. Because the materials of the core and prepreg are composite materials, there are problems of difficult matching for the electric characteristic (such as $D_k$, dielectric constant) and mechanical characteristic (such as CTE, coefficient of expansion).

Furthermore, the thickness of the dielectric layer according to prior arts results in that the distance from one metal line to the adjacent one in the same metal structure layer is considerably same as the distance to the reference plane or even closer. (Theoretically, it is better for any metal line to be far way from the adjacent metal line and to be closer to the reference plane.) Then, the signal transmitted in one metal line can be easily interfered by the signal transmitted in the adjacent metal line. The electric fields and performances of the signals transmitted in the adjacent metal lines interfere with each other and cause serious problems of the signal integrity, such as, crosstalk when high-frequency signals are transmitted through a stripline, high frequency noise and backward coupling caused by parasitic inductance and parasitic capacitor of the vias.

For transmitting the high frequency signal, the present invention manufacturing the thin dielectric layers for three main purposes: (1) area of the transmission path and backflow path of the metal line is small and hardly interfered by other signals, (2) crosstalk influence can be reduced when high-frequency signal is transmitted through a stripline and the layout density of the metal lines can be increased, and (3) via can be shortened to reduce high frequency noise caused by parasitic inductance and parasitic capacitor.

When manufacturing a multi-layer substrate in PCB industry, it is better that metal lines of different substrate products can be controlled in the same impedance value, i.e. impedance matching because there are signals transmitted therebetween. The reason is: signal will split into reflection part and incidence part when the signal transmission suffers a connection interface of two metal lines of different products if the two metal lines have different impedance values. The signal integrity can be destroyed. Therefore, there will be a predetermined impedance matching when manufacturing a multi-layer substrate in the PCB industry.

Please refer to FIG. 2 and FIG. 3. FIG. 2 depicts a profile of a metal line located in a thin dielectric layer. FIG. 3 depicts a relationship diagram of an impedance value of the metal line which takes an adjacent metal layer as ground connection versus a ratio of $H_1/W$ (height from ground/width of the metal line) in the multi-layer substrate shown in FIG. 2. The metal line 201 in FIG. 2 is located in a dielectric layer. Supposing the dielectric constant of the dielectric layer is $\epsilon_r$, the width and height of the metal line 201 are W and T. The distances to the upper and lower metal structure layer is $H_2$ and $H_1$ (the lower metal structure layer is taken as ground connection). FIG. 3 shows relationship between a related value of impedance $\sqrt{\epsilon_r} Z_0$ and the ratio of $H_1/W$ for the metal line 201 shown in FIG. 2. Accordingly, for a predetermined impedance matching and a predetermined $H_1/H_2$ ratio, the solution for the ratio of $H_1/W$ is unique. Therefore, for manufacturing a smaller multi-layer substrate and still satisfy the predetermined impedance, $H_1$ has to be smaller, i.e. the thickness of the dielectric layer has to be thinner.

Please refer to FIG. 4 and FIG. 5. FIG. 4 depicts a profile of several parallel metal lines located in a thin dielectric layer. FIG. 5 depicts a relationship diagram of a backward coupling of crosstalk versus a ratio of $H_1/S$ (height from ground/separated distance) when high-frequency signal is transmitted through the metal line in the multi-layer substrate shown in FIG. 4. The metal lines 401, 402 and 403 in FIG. 4 are located in the same dielectric layer. Supposing the dielectric constant of the dielectric layer is $\epsilon_r$. For example, the width and height of the metal line 402 are W and T. The separated distance is S. The distances to the upper and lower metal structure layer is $H_2$ and $H_1$. $C_{10}$, $C_{20}$, $C_{30}$, $C_{12}$, $-C_{12}$, $-C_{13}$, $-C_{23}$ represent parasitic capacitors between the metal lines. The signal in metal line 401 generates backward coupling to the signal in the metal line 402 at the end of the metal line 402. The formula can be described as below:

$$V_{21} \approx b_{21}[V_0(t)-V_0(t-2\tau D)] \quad (1)$$

$$b_{21} \approx 0.25(-C_{21}/C_{22}+L_{21}/L_{11}) \quad (2)$$

$V_0(t)$ is the signal voltage inputted at the end of the metal line 401. The τD represents distance that the signal has been transmitted. $L_{21}$ and $L_{11}$ represent the parasitic inductances. Formula (1) means that the value $V_{21}$ representing generated crosstalk and backward coupling is proportional to the coefficient $b_{21}$. FIG. 5 shows the proportional relation between the coefficient $b_{21}$ and the ratio $H_1/S$. Accordingly, with a hypothesis of predetermined S and predetermined W, the smaller the $H_1$ gets, the smaller the coefficient $b_{21}$ is, i.e. influence of the crosstalk and backward coupling is smaller. The signal integrity is better. More detail description about crosstalk, backward coupling and the high frequency noise caused by parasitic inductance and parasitic capacitor of the vias can be found in IBM J. RES. DEVELOP., VOL. 32, NO. 5, SEPTEMBER 1988.

In brief, a greatly thin dielectric layer can satisfy the request of impedance matching and is capable of further reducing the influence of crosstalk and backward coupling. Meanwhile, vias in the dielectric layers can be shortened to reduce high frequency noise caused by parasitic inductance and parasitic capacitor.

Moreover, when a high integration flexible multi-layer substrate is manufactured, effects of the mechanical characteristic (such as CTE, coefficient of expansion), warpage or twist, inner or outer stresses to the flexible multi-layer substrate and the limitation to thickness thereof have to be concerned further. Many different materials employed in the prior arts result in difficulty of the mechanical characteristic matching. The end product of the multi-layer substrate according to prior arts is thicker and losses the expected flexibility.

In conclusion, there is a need to develop a thin multi-layer substrate that takes fewer processes, fewer materials than prior arts without using prepreg. The thin dielectric layer can match with the thickness of the metal lines (metal structure layer), accordingly, to solve drawbacks of prior arts so as to promote the entire quality and yield of manufacturing the multi-layer substrate. Furthermore, the thin multi-layer substrate still keeps good signal integrity when satisfying demands of miniaturization for the multi-layer substrate, especially satisfying demands of miniaturization for the flexible multi-layer substrate.

SUMMARY OF THE INVENTION

An objective of the present invention is to provide a manufacturing method of the multi-layer substrate which is more suitable for flexible multi-layer substrate.

Another objective of the present invention is to provide a manufacturing method of a multi-layer substrate taking fewer processes, fewer materials and has greatly thin dielectric layers. Following concern of impedance matching, the metal line of the multi-layer substrate can keep good signal integrity therein.

For accomplishing aforesaid objectives of the present invention, the present invention employs a carrier to alternately form dielectric layers and metal structure layers thereon. Each dielectric layer adheres with the adjacent dielectric layer to embed the metal structure layers in the dielectric layers corresponding thereto. The dielectric layers of the present invention are formed by a coating process. The metal structure layers formed by Etching, Electroplating or Metal Lift-Off methods are for transmitting signals or power. The present invention also makes vias in the dielectric layers at predetermined positions by Etching or other method to connect the metal structure layers adjacent therewith. The dielectric layer at a surface of the multi-layer substrate can be employed as a solder mask layer. Comparing with prior arts, which have to use prepregs when hot pressing and adhering every layer of different materials, the present invention takes fewer processes, fewer materials and without using prepregs.

According to the manufacturing method of the present invention, the thickness of the dielectric layer can be greatly reduced than the dielectric layer of the prior arts. Comparing with the 8-layer substrate products which's thickness is about 600 μm, one single layer thickness of the multi-layer substrate according to the present invention can reach below 10 μm and the thickness of an 8-layer substrate product can be about 80~90 μm, and even thinner. Moreover, the present invention not only shrinks the size of the multi-layer substrate but also satisfies concern of impedance matching due to the greatly thin dielectric layer. Furthermore, crosstalk influence can be reduced when the high-frequency signal is transmitted through a Stripline. The present invention can keep good signal integrity and increase layout density.

DETAILED DESCRIPTION OF THE INVENTION

Figure 1:
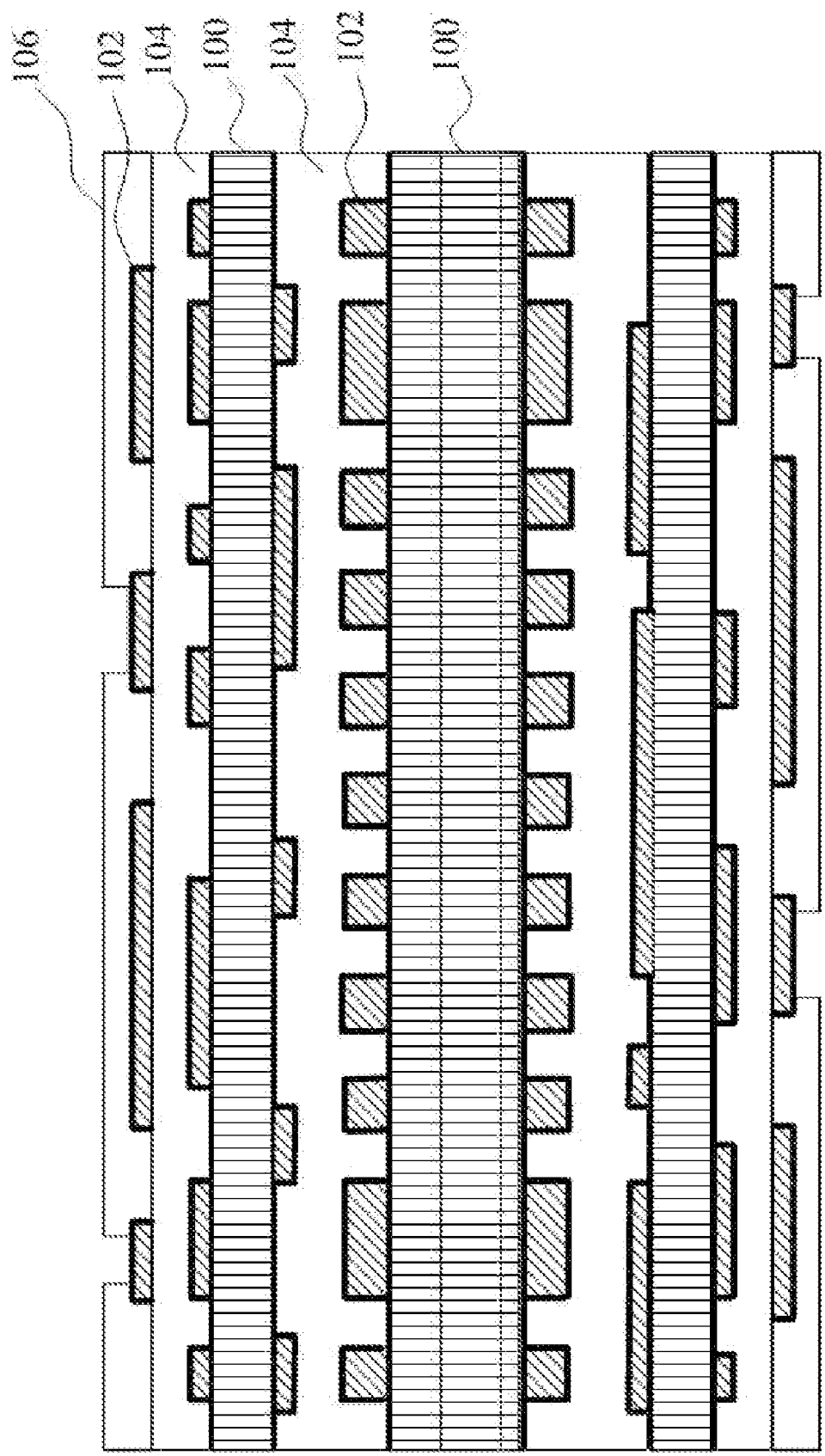
FIG. 1 depicts a diagram of multi-layer substrate manufactured by hot pressing and adhering different layers according to prior art.
Figure 2:
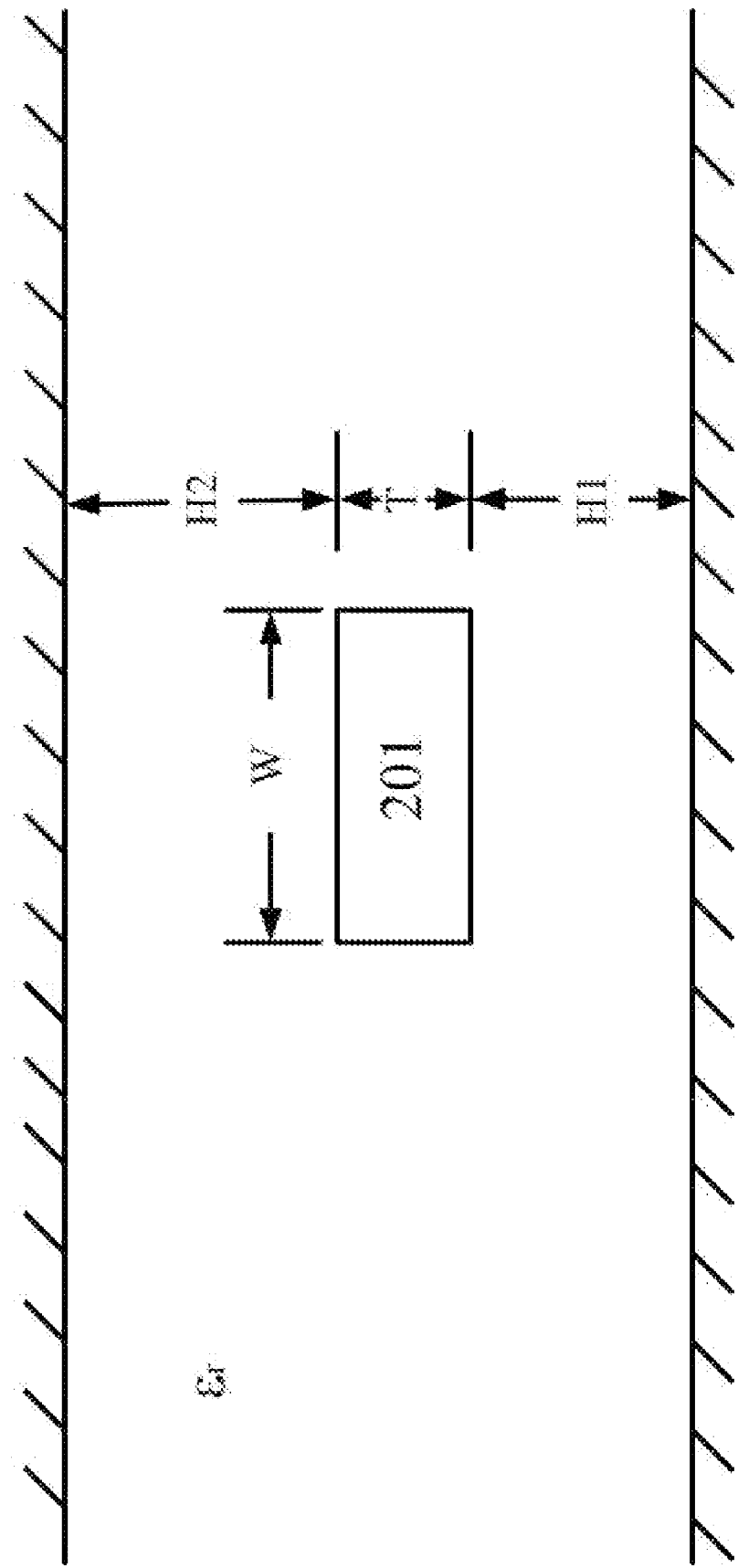
FIG. 2 depicts a profile of a metal line located in a thin dielectric layer.
Figure 3:
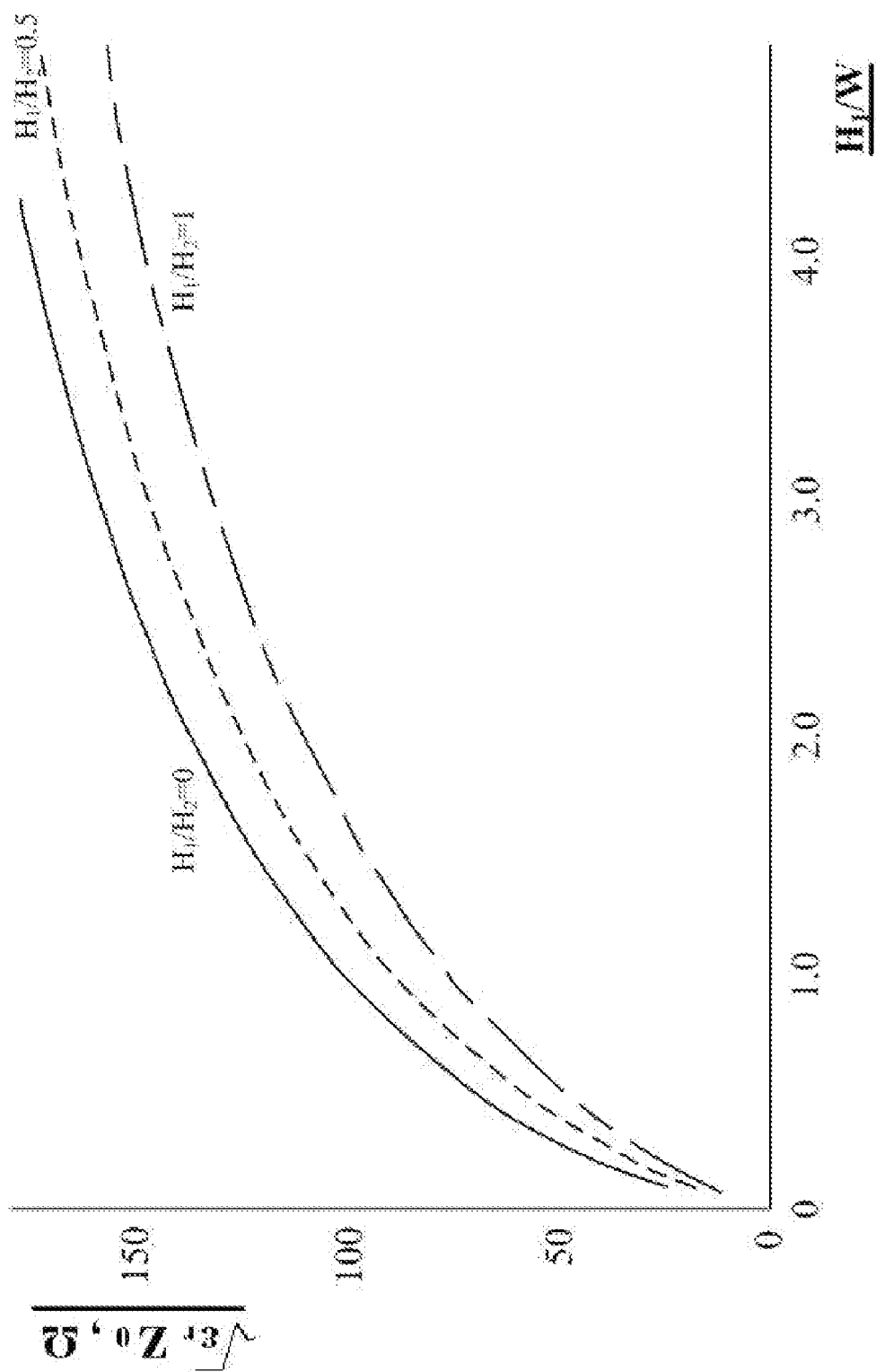
FIG. 3 depicts a relationship diagram of an impedance value of the metal line which takes an adjacent metal layer as ground connection versus a ratio of $H_1/W$ (height from ground/width of the metal line) in the multi-layer substrate shown in FIG. 2.
Figure 4:
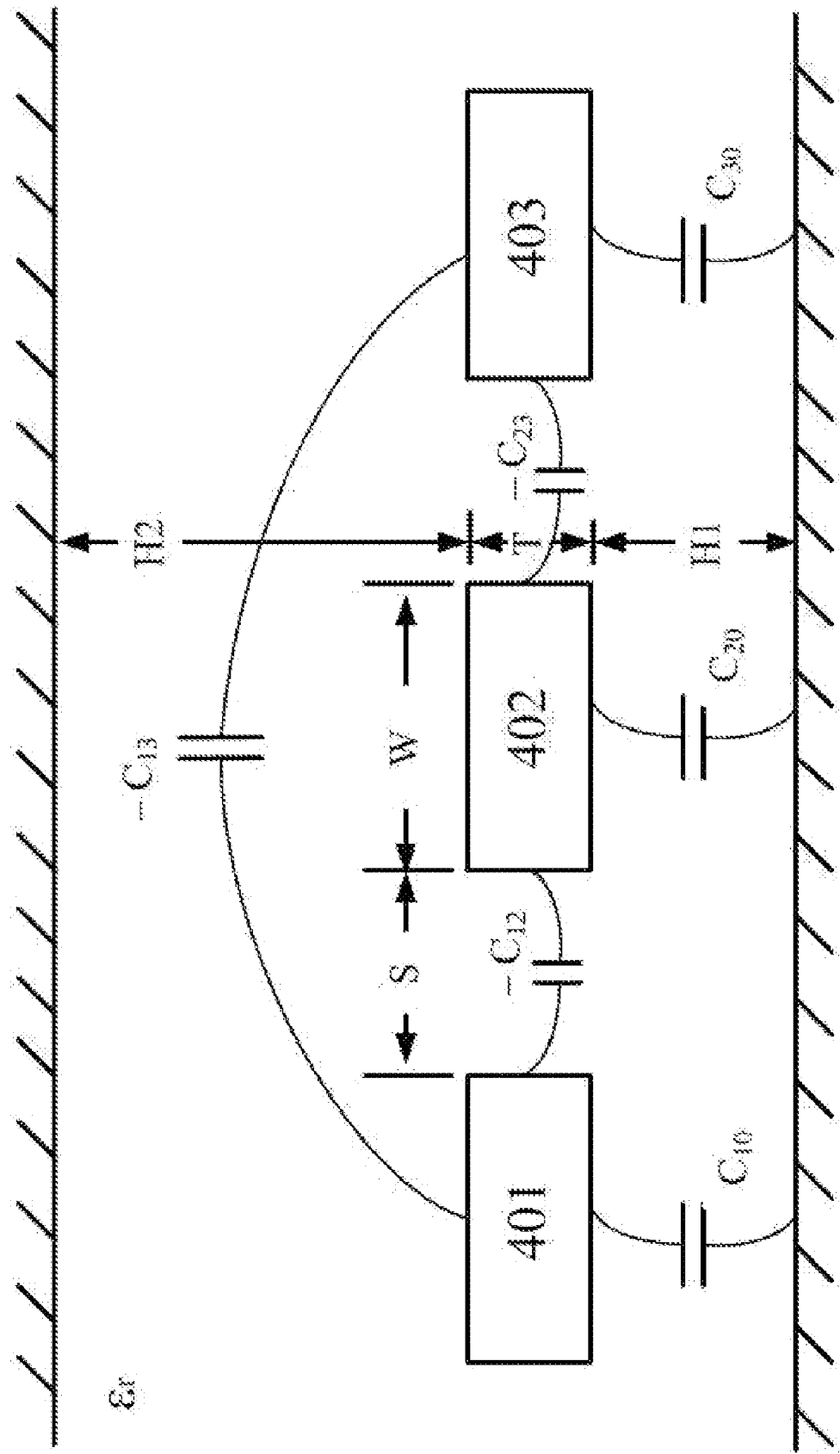
FIG. 4 depicts a profile of several parallel metal lines located in a thin dielectric layer.
Figure 5:
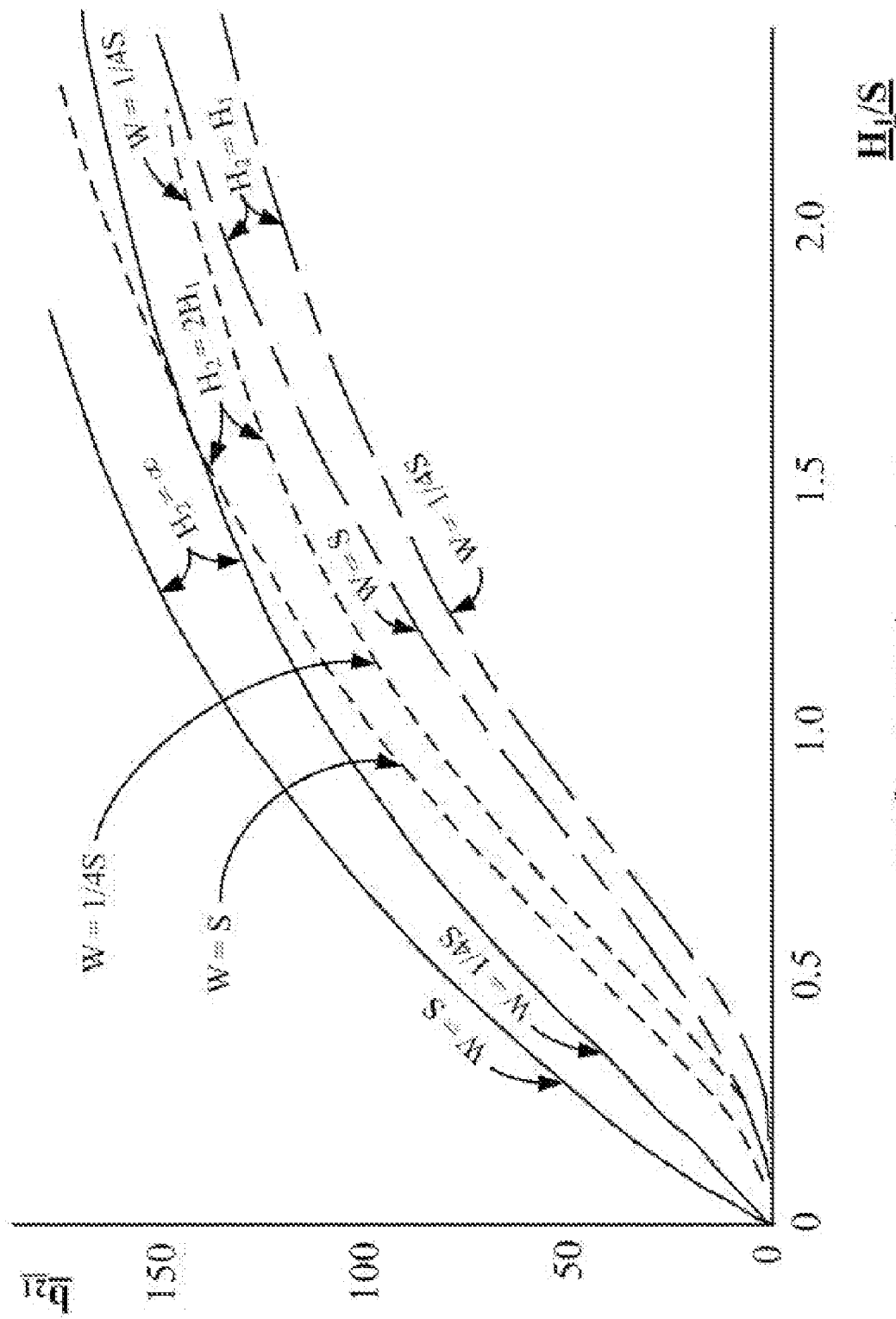
FIG. 5 depicts a relationship diagram of a backward coupling of crosstalk versus a ratio of $H_1/S$ (height from ground/separated distance) when high-frequency signals are transmitted through the metal lines in the multi-layer substrate shown in FIG. 4.
Figure 6A:
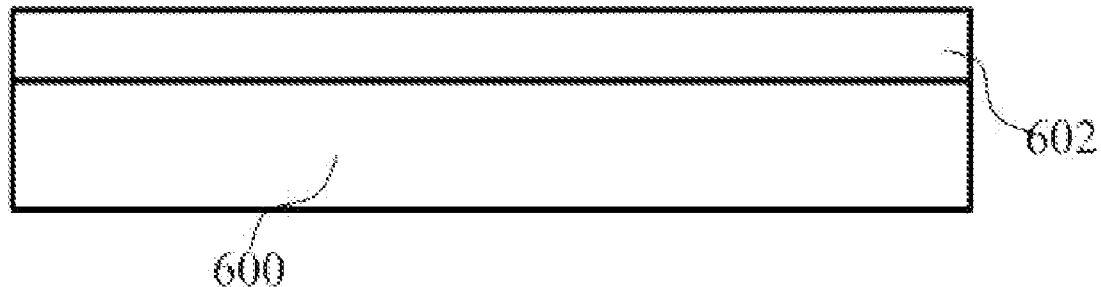
FIG. 6A to FIG. 6D depict a structural flowchart of a manufacturing method according to the present invention.
Figure 6B:
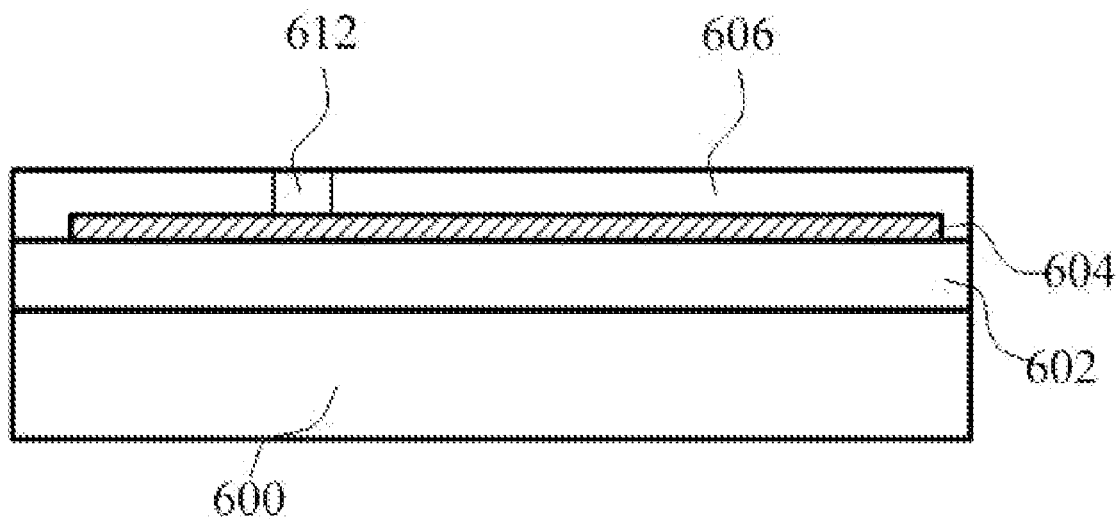
Figure 6C:
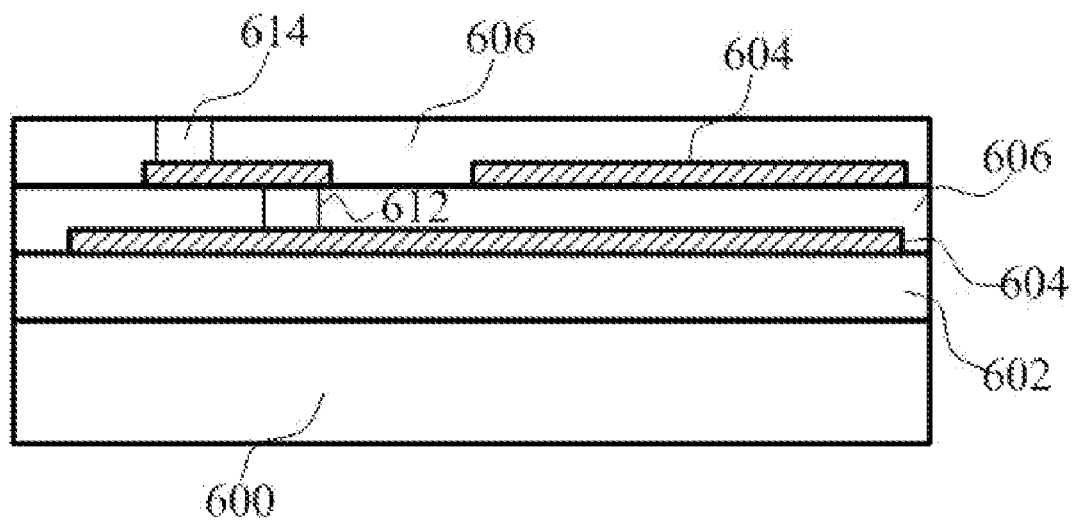
Figure 6D:
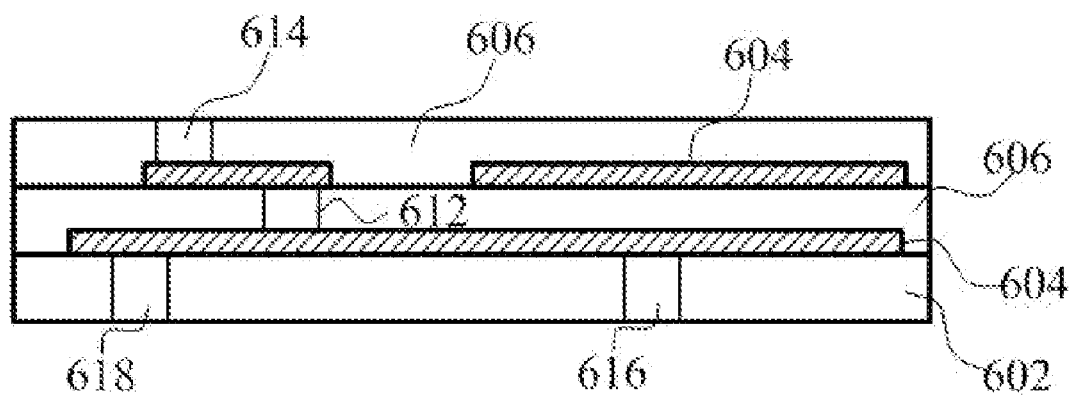

Please refer to FIG. 6A to FIG. 6D, which depict a structural flowchart of a manufacturing method according to the present invention. FIG. 6A shows steps of providing a carrier 600 and coating a first dielectric layer 602 on the carrier. FIG. 6B shows steps of forming a metal structure layer 604 on the first dielectric layer 602, proceeding a patterning process thereon, and then forming a second dielectric layer 606 on the metal structure layer 604, making a via 612 in the second dielectric layer 606. FIG. 6C shows steps of forming another metal structure layer 604 on the second dielectric layer 606, proceeding a patterning process thereon, and then forming another second dielectric layer 606 on the aforesaid metal structure layer 604, making a via 614 in the aforesaid second dielectric layer 606. Then, a multi-layer substrate is formed on the carrier 600. FIG. 6D shows a step of separating the multi-layer substrate from the carrier 600 to accomplish manufacturing the multi-layer substrate of the present invention.

Depending on requests when designing the multi-layer substrate, vias 616 and 618 can be formed in the first dielectric layer 602 at the surface of the multi-layer substrate after separating the multi-layer substrate from the carrier 600. The first dielectric layer 602 at the surface of the multi-layer substrate can be employed as a solder mask. Besides, the aforesaid second dielectric layer 606 having the via 614 therein can also be employed as a solder mask. Moreover, vias 616 and 618 can be formed after the first dielectric layer 602 is formed on the carrier 600, and then forming the metal structure layer 604 thereon. As aforementioned, the first dielectric layer 602 just becomes the solder mask after the multi-layer substrate is separated from the carrier 600.

The first dielectric layer 602 and the second dielectric layers 606 of the present invention are formed by a coating process. The present invention dries these dielectric layers to harden thereof. The aforesaid coating process of the present invention can be Spin Coating, Extrusion Die Coating, Roll Coating or other coating process. The wet layer thickness of the spin coating is about 1~50 μm. The wet layer thickness of the Extrusion Die Coating is about 10~1000 μm. The wet layer thickness of the Roll Coating is about 5~500 μm. However, the actual wet layer thickness depends on the properties of the coating material (such as: viscosity, surface tension and etc.) and process parameters (such as: rotation speed, coating material quantity, coating speed and etc.). Then, the most important drying and hardening process decides the final layer thickness of the first dielectric layer 602 and the second dielectric layers 606. The solid content and the hardening shrinkage rate decide the final layer thicknesses thereof. Generally, the final layer thickness is 30~50% of the wet layer thickness.

The present invention decides the required thicknesses of the first dielectric layer 602 and the second dielectric layers 606 by selecting the type of coating process, changing the properties of the coating material, the process parameters, the drying and hardening process parameters. Significantly, the present invention basically employs two materials for manufacturing the multi-layer substrate, for example, the material of the first and second dielectric layers can be polyidmide or Benzocyclobutene or other. Alternatively, the material of the first dielectric layer and the material of the second dielectric layers can be different. The material of the metal structure layer can be copper or aluminum. Comparing with the prior arts, the fewer kinds of materials are used, the mechanical characteristic matching is easier and the entire process is simpler. Therefore, it is more suitable for a flexible multi-layer substrate and can promote the entire quality and yield of the multi-layer substrate to reduce cost of the manufacturing process.

Furthermore, with coating process to form the aforesaid second dielectric layers 606 and to cover the aforesaid metal structure layers 604 according to the present invention, the metal structure layers 604 are embedded in the second dielectric layers 606 corresponding thereto. Meanwhile the first dielectric layer 602 and the second dielectric layers 606 can adhere with the adjacent ones because they are of the same materials. Unlike prior arts by hot pressing and adhering each layer, prepreg between each layer is essential for making the layers adhered to each other. An interface adhesion enhancing process can be implemented between the first dielectric layer 602 and the second dielectric layers 606, such as, a plasma treatment process to increase adhesion intensities therebetween.

With coating process to form the aforesaid second dielectric layers 606, laterals of the metal lines (metal structure layer) bond closely with the second dielectric layers 606 corresponding thereto. Meanwhile, for connecting the adjacent metal lines, vias 612, 614, 616 and 618 can be made in the first dielectric layers 602 and the aforesaid second dielectric layers 606.

Therefore, taking an 8-layer multi-layer substrate as example, the product of prior arts is about 600 μm. The present invention can reduce the thickness of the 8-layer multi-layer substrate product to about 80~90 μm.

With concern of impedance matching, crosstalk and backward coupling influence to high-frequency signal transmission can be decreased by the present invention. Meanwhile, via can be shortened to reduce high frequency noise caused by parasitic inductance and parasitic capacitor with thin dielectric layer. Signal integrity still can be kept good as increasing the layout density for the multi-layer substrate.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A manufacturing method of a multi-layer substrate, comprising steps of:
   a. providing a carrier;
   b. coating a first dielectric layer on the carrier;
   c. drying the first dielectric layer to harden thereof;
   c1. making at least one via in the first dielectric layer, so as to be a solder mask layer;
   d. forming a metal structure layer on the first dielectric layer;
   e. coating a second dielectric layer on the metal structure layer;
   f. drying the second dielectric layer to harden thereof; and
   g. separating the multi-layer substrate from the carrier.

2. The manufacturing method of claim 1, further comprising a step of repeating step d to step f, to stack up the second dielectric layers and the metal structure layers alternately and the second dielectric layers adhere respectively to embed the metal structure layers in the second dielectric layers corresponding thereto.

3. The manufacturing method of claim 2, further comprising a step of making at least one via in the second dielectric layers to connect the metal structure layers adjacent therewith after each step f.

4. The manufacturing method of claim 2, further comprising a step of implementing an interface adhesion enhancing process to increase adhesion intensities therebetween before each step e.

5. The manufacturing method of claim 4, wherein the interface adhesion enhancing process is a plasma treatment process.

6. The manufacturing method of claim 1, further comprising a step of implementing an interface adhesion enhancing process to increase adhesion intensity between the first dielectric layer and the second dielectric layer before step e.

7. The manufacturing method of claim 6, wherein the interface adhesion enhancing process is a plasma treatment process.

8. The manufacturing method of claim 1, wherein step e is to make laterals of the metal structure layers bond closely with the second dielectric layers corresponding thereto.

9. A manufacturing method of a multi-layer substrate, comprising steps of:
   a. providing a carrier;
   b. coating a first dielectric layer on the carrier;
   c. drying the first dielectric layer to harden thereof;
   d. forming a metal structure layer on the first dielectric layer;
   e. coating a second dielectric layer on the metal structure layer;
   f. drying the second dielectric layer to harden thereof;
   g. separating the multi-layer substrate from the carrier; and
   g1. making at least one via in the first dielectric layer, so as to be a solder mask layer.

* * * * *